United States Patent [19]

Tsunoda

[11] 4,137,563

[45] Jan. 30, 1979

[54] CIRCUITRY FOR REDUCING POWER DISSIPATION IN EQUIPMENT WHICH OPERATES IN SYNCHRONISM WITH CLOCK PULSES

[75] Inventor: Takashi Tsunoda, Tokyo, Japan

[73] Assignee: Canon Kabushiki Kaisha, Tokyo, Japan

[21] Appl. No.: 807,656

[22] Filed: Jun. 17, 1977

[30] Foreign Application Priority Data

Jun. 30, 1976 [JP] Japan ................................. 51-77186

[51] Int. Cl.² .................. G06F 1/04; G06F 13/00; G11C 7/00
[52] U.S. Cl. .................................. 364/200; 307/217; 307/269; 365/189; 365/195; 365/233
[58] Field of Search ... 364/200 MS File, 900 MS File; 340/173 R; 307/208, 217, 247 R, 269; 328/63, 72; 365/226, 227, 189, 193, 195, 233

[56] References Cited

U.S. PATENT DOCUMENTS

| 3,453,601 | 7/1969 | Bogert et al. | 364/200 |
|---|---|---|---|
| 3,508,207 | 4/1970 | Shigaki | 364/900 |
| 3,576,433 | 4/1971 | Lee et al. | 364/900 X |
| 3,702,463 | 11/1972 | Lesniewski | 364/200 |
| 3,736,569 | 5/1973 | Bouricius et al. | 364/200 |
| 3,740,730 | 6/1973 | Ho et al. | 340/173 R |
| 3,745,380 | 7/1973 | Kitajima et al. | 307/269 X |
| 3,919,695 | 4/1975 | Gooding | 364/200 |
| 3,970,995 | 7/1976 | Baudouin et al. | 365/900 |
| 3,997,800 | 12/1976 | Bain | 307/269 |
| 4,060,794 | 11/1977 | Feldman et al. | 364/200 |

Primary Examiner—Melvin B. Chapnick
Attorney, Agent, or Firm—Fitzpatrick, Cella, Harper & Scinto

[57] ABSTRACT

A minimum number of clock pulses required for keeping an electronic component in a waiting condition or state are intermittently applied to the electronic component, thereby minimizing the heat dissipation thereof. A control circuit, utilized in the invention, provides an output signal which permits continuous clock signals to be applied, for example, to memory chips, during read and write periods, but such control circuit reduces the number of clock signals applied to the memory chips during periods when the read and write processes are not required.

12 Claims, 2 Drawing Figures

CIRCUITRY FOR REDUCING POWER DISSIPATION IN EQUIPMENT WHICH OPERATES IN SYNCHRONISM WITH CLOCK PULSES

BACKGROUND OF THE INVENTION

1. Field of the Invention

The present invention relates to an electronic equipment or system adapted to operate in synchronism with clock pulses.

2. Description of the Prior Art

In general, almost all of the electronic circuits of electronic equipment or systems have been made of semiconductors so that the electronic circuits generate less heat. However, clock pulse signals are normally applied, for instance, to digital circuits so that the latter are always consuming power and consequently dissipating heat. Since the heat capacity of semiconductors is relatively low, the heat thus generated and accumulated tends to cause malfunctions or erratic operations of the electronic circuits.

SUMMARY OF THE INVENTION

In view of the above, one of the objects of the present invention is to provide an electronic equipment or system incorporating a clock pulse frequency control circuit for controlling the drive or operation of components in the equipment, thereby preventing the overheating thereof which leads to the malfunctions or erratic operations.

Another object of the present invention is to provide an electronic equipment or system wherein clock pulse signals to be applied to memory means may be periodically varied.

A further object of the present invention is to provide an electronic equipment provided with a clock pulse frequency control means for intermittently applying or periodically suppressing clock pulses to be applied to memory means.

The above and other objects, features and advantages of the present invention will become apparent from the following description of one preferred embodiment thereof taken in conjunction with the accompanying drawings.

DESCRIPTION OF THE PREFERRED EMBODIMENT

Figure 1:
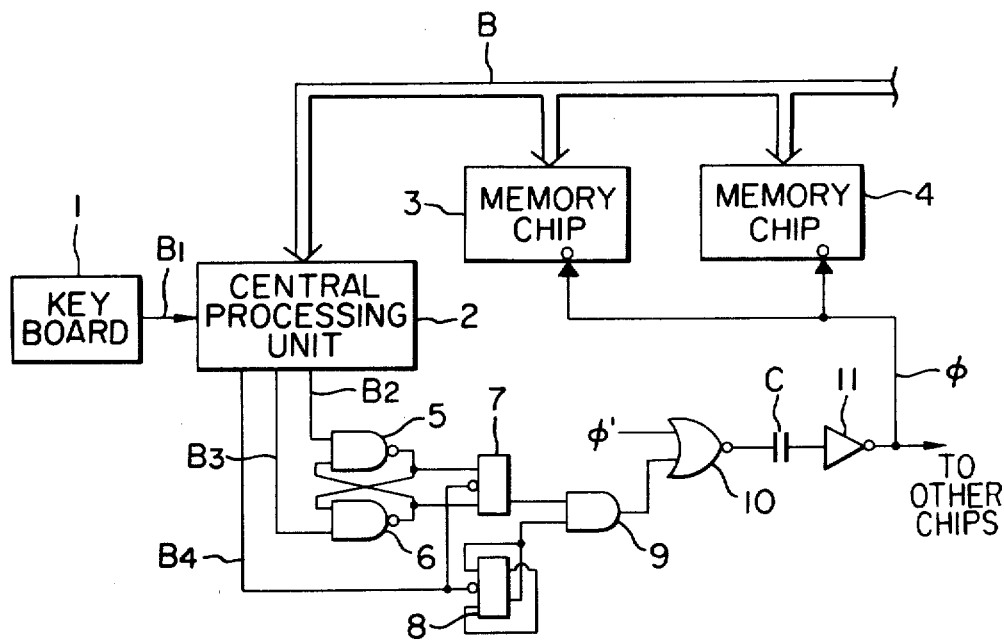
FIG. 1 is a block diagram of an electronic equipment incorporating a clock pulse frequency control circuit in accordance with the present invention.

Referring to FIG. 1 illustrating a block diagram of an electronic computer incorporating an electronic equipment with a control circuit in accordance with the present invention, a keyboard 1 of the conventional type is connected through a signal line B1 to a central processing unit 2 adapted to generate signals in response to depression of one of the keys on the keyboard 1. That is, a high level signal which is normally maintained on a signal line B2 is changed to a low level signal which is maintained for a predetermined time. More particularly, the keying operation is detected by a conventional decoder, and the low level signal may be terminated by adding a step for changing the low level signal to the high level signal to the last of the control steps to be accomplished in response to the keying operation. And these control steps may be easily accomplished especially by an electronic equipment incorporating a read-only memory.

Figure 2:
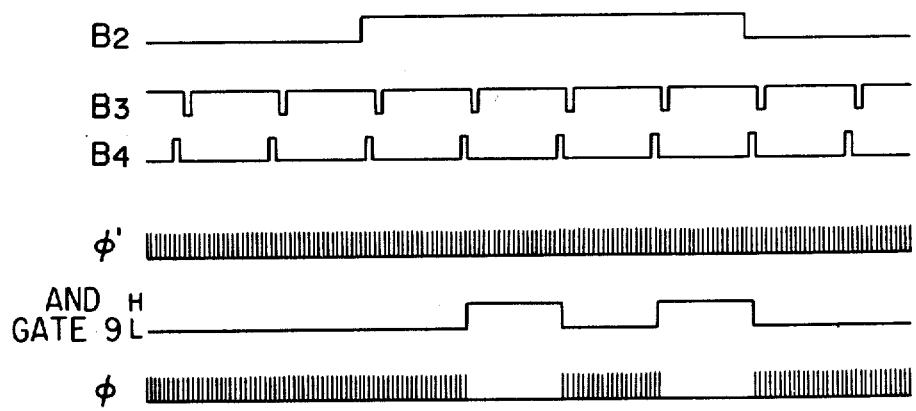
FIG. 2 shows waveforms of various signals used for the explanation of the present invention.

The central processing unit 2 is connected through signal lines B2 and B3 to first and second NAND gates 5 and 6 and connected through a signal line B4 to first and second flip-flops 7 and 8. Repetitive signals are transmitted through the signal lines B3 and B4 at frequencies (which may be equal, for instance, to one word) as shown in FIG. 2.

The first and second NAND gates 5 and 6 are cross coupled to each other to form a latch circuit. That is, the signal line B2 is connected to one of the two input terminals of the first NAND gate 5 and the other input of the first NAND gate 5 is connected to the output terminal of the second NAND gate 6. The signal line B3 is connected to one of the two input terminals of the second NAND gate 6 and the other input terminal of the second NAND gate 6 is connected to the output terminal of the first NAND gate 5.

The output terminals of the first and second NAND gates 5 and 6 are connected to set and reset terminals, respectively, of the first flip-flop 7, and the signal line B4 is connected to a clock terminal of the first flip-flop 7 so that the clock signals may be transmitted thereto from the central processing unit 2.

The clock signal line B4 is connected to a clock terminal of the second flip-flop 8, and the set and reset output terminals of that flip-flop are connected respectively to the reset and set input terminals thereof, so that the second flip-flop 8 may be periodically shifted between two states in response to the clock signals.

The reset output terminal of the second flip-flop 8 is connected to one of the two input terminals of an AND gate 9 while the reset output terminal of the flip-flop 7 is connected to the other input terminal of the AND gate 9. The output terminal of AND gate 9 is connected to one of the two input terminals of a NOR gate 10, and clock signals $\phi'$ as shown in FIG. 2, are applied to the other input terminal of NOR gate 10 from a clock pulse generator (not shown).

The output terminal of NOR gate 10 is connected through a capacitor C to an input terminal of an amplifier 11 which amplifies the clock pulses, and the output of the amplifier 11 is applied as a clock signal to clock input terminals CT of dynamic memory chips 3 and 4 which store the data processed by and transmitted from the central data processing unit 2 through a bus B. That is, the chips 3 and 4 intercommunicate with the central processing unit 2 through the bus B.

Next, the mode of operation of the preferred embodiment with the above construction will be described. When one depresses one of the keys on the keyboard 1, a signal is generated and transmitted through the signal line B1 to the central processing unit 2, which in turn detects or confirms that the specific key has been depressed and the consequent operations to be executed. As a result, the high level signal on the signal line B2 changes to the low level signal so that the first NAND gate 5 outputs a high level signal while the second NAND gate 6 outputs a low level signal. Consequently, in response to the clock signal transmitted through the signal line B4 a low level signal appears at the reset output terminal of the first flip-flop 7 and is applied to AND gate 9 so that the output from the second flip-flop 8 which is periodically turned on and off is no longer transmitted through AND gate 9 to NOR gate 10. On the other hand, the clock pulses φ are normally transmitted through NOR gate 10, the capacitor C and the amplifier 11 to the memory chips 3 and 4 as driving pulses so that depending upon the function of the depressed key on the keyboard 1 the data is stored to the memory chips 3 and 4 or the contents therein are read out.

Thereafter the central processing unit 2 causes the low level signal on the signal line B2 to rise to the high level so that in response to the clock signal transmitted through the signal line B3 the output of the second NAND gate 6 rises to the high level while the output of the first NAND gate 5 is lowered to the low level. As a result, in response to the clock signal transmitted through the signal line B4, the reset output of the first flip-flop 7 changes from the low level to the high level signal which is transmitted to the AND gate 9 so that the output from the second flip-flop 8 is now transmitted through AND gate 9 to NOR gate 10. Thus, the NOR gate 10 permits the clock pulses φ to be transmitted to the memory chips 3 and 4 only when the reset output from the second flip-flop 8 is at a low level. Consequently the clock pulses φ are turned on and off alternately at a time interval equal to one word time as shown in FIG. 2 so that current flowing through the chips 3 and 4 may be reduced and consequently heat dissipation may be minimized with a resultant low temperature rise of the memory chips 3 and 4.

So far, the memory chips have been described as being driven every one word time, but it will be understood that they may be driven every n word time (where n is a positive integer). This feature of the present invention may be applied to every electronic equipment of the type which is driven in response to clock pulses.

When the next key depression is detected by the central processing unit 2, the latter causes the high level signal on the signal line B2 to change to the low level signal so that the clock pulses φ may be continuously supplied to the chips 3 and 4 in the manner described above.

In summary, according to the present invention an electronic equipment or component which is in waiting condition is supplied with a minimum number of clock pulses required for keeping the electronic component in its ready state. Thus, power consumption and hence heat dissipation can be advantageously minimized.

What I claim is:

1. An electronic equipment comprising:
   storage means for storing data in synchronism with clock pulses applied thereto;
   control signal generating means for generating a first control signal during periods when the stored data is to be read-out from said storage means, and for generating a second control signal during a hold cycle of said storage means when the stored data is not to be read-out therefrom; and
   clock pulse applying means coupled to said storage means and said control signal generating means for applying a first clock pulse train to said storage means in response to the first control signal from said control signal generating means, and applying a second clock pulse train to said storage means in response to the second control signal from said control signal generating means, wherein said second clock pulse train has a fewer number of clock pulses during a predetermined time period as compared to said first clock pulse train.

2. An electronic equipment according to claim 1 wherein a single clock pulse train is applied as an input to said clock pulse applying means; said single clock pulse train is applied to said storage means as said first pulse train; and said clock pulse applying means includes a control circuit means for producing a third control signal to inhibit a certain number of pulses from said single clock pulse train, and to apply the resultant pulse train to said storage means as said second pulse train.

3. An electronic equipment according to claim 2 wherein said control circuit means produces the third control signal every N word time.

4. An electronic equipment according to claim 1 wherein said storage means has at least one input terminal to which the first and second clock pulse trains are applied.

5. An electronic equipment comprising:
   pulse generating circuit means for generating a predetermined frequency of clock pulses;
   electronic circuit means, having an access mode and a standby mode, to which said clock pulses from said pulse generating circuit means are applied;
   control signal generating means for generating a first control signal having a first level while said electronic circuit means is operative in said access mode, and generating a second control signal having a second level while said electronic circuit means is in said standby mode; and
   clock pulse applying means coupled to said electronic circuit means and said control signal generating means for continuously applying said clock pulses to said electronic circuit means in response to said first control signal, and for intermittently applying said clock pulses to said electronic circuit means in response to said second control signal.

6. An electronic equipment according to claim 5 wherein said clock pulse applying means includes a control circuit means for producing a third control signal to provide said intermittently applied clock pulses.

7. An electronic equipment according to claim 6 wherein said control circuit means produces the third control signal every N word time.

8. An electronic equipment according to claim 5 wherein said electronic circuit means has at least one input terminal to which said continuous and intermittent clock pulses are applied.

9. An electronic equipment comprising:
   a semiconductor storage means for storing data in synchronism with a predetermined frequency of clock pulses applied thereto, said storage means having an input terminal to which the clock pulses are applied;
   a control signal generating means for generating a first control signal while said storage means is to be operative in a write mode, and for generating a second control signal while said storage means is to be operative in a data hold mode; and
   clock pulse applying means coupled to said storage means and said control signal generating means for continuously applying said clock pulses to said storage means in response to said first control signal, and for intermittently applying said clock pulses to said storage means in response to said second control signal.

10. An electronic equipment according to claim 9 further comprising keyboard input means for entering numerical information, said input means being coupled to said semiconductor storage means and said control signal generating means, wherein said control signal generating means produces said first control signal in response to the output signal from said keyboard input means.

11. An electronic equipment according to claim 9 wherein said clock pulse applying means includes a control circuit means for producing a third control signal to provide said intermittently applied clock pulses.

12. An electronic equipment according to claim 11 wherein said control circuit means produces the third control signal every N word time.

* * * * *